United States Patent [19]

Ovshinsky et al.

[11] Patent Number: 5,198,414

[45] Date of Patent: * Mar. 30, 1993

[54] IN-SITU GROWTH OF FLOUROUNATED SUPERCONDUCTING, Y-BA-CU-O THIN FILMS ON SAPPHIRE SUBSTRATES WITH A BUFFER LAYER BY LASER ABLATION

[75] Inventors: Stanford R. Ovshinsky, Bloomfield Hill; Rosa Young, Troy; Gerard Van der Leeden, Troy; Benjamin S. Chao, Troy, all of Mich.

[73] Assignee: Energy Conversion Devices, Inc., Troy, Mich.

[*] Notice: The portion of the term of this patent subsequent to Jun. 23, 2009 has been disclaimed.

[21] Appl. No.: 770,733

[22] Filed: Oct. 1, 1991

Related U.S. Application Data

[63] Continuation of Ser. No. 569,502, Aug. 20, 1990, abandoned, which is a continuation of Ser. No. 402,313, Sep. 5, 1989, abandoned.

[51] Int. Cl.$^5$ .......................... B05D 5/12; B05D 3/06
[52] U.S. Cl. ........................................ 501/1; 505/732; 505/730; 505/785; 427/62; 427/314; 427/586
[58] Field of Search .................. 505/1, 732, 730, 785; 427/62, 53.1, 314

[56] References Cited

PUBLICATIONS

Roas et al., "Epitaxial growth of $YBa_2Cu_3O_{7-x}$ thin films by a laser evaporation process", Appl. Phys. lett. 53(16) Oct. 1988 pp. 1557-1559.
Inam et al, "As-deposited high Tc and Jc Superconducting thin films made at low temperatures", Appl. Phys. lett. 53(10) Sep. 1988 pp. 908-910.
Politis et al, "Preparation and superconducting properties of $La_{1.8}Sr_{0.2}CuO_4$ and $YBa_2Cu_3O_{6.5}$", MRS proceedings of Symposium (Apr. 1987) (Anaheim, Calif.) edited by Gubser et al, pp. 141-143.
Ovshinsky et al, "Superconductivity at 155K", Phys. Rev. letters, vol. 58, No. 24, Jun. 15, 1987 pp. 2579-2581.
DeSantolo et al, "Preparation of high Tc and Jc films of $Ba_2YCu_3O_7$ using laser evaporation of a composite target containing $BaF_2$", Appl. Phys. lett. 52(23) Jun. 1988 pp. 1995-1997.
Garzon et al, "Characterization of Y-Ba-Cu-O superconducting thin films prepared by coevaporation of Y, Cu, and $BaF_2$" Appl. Phys. lett. 54(14) Apr. 1989 pp. 1365-1367.
Rautioaho et al, "Studies to prepare superconducting thick films on aluminum oxide and zirconium oxide substrates", Proc. SPIE-Int. Soc. Opt. Eng. 1988 948 (High-Tc Supercond.) pp. 31-36.
Burton et al, "Microstructural investigation of $YBa_2Cu_3O_{7-8}$ films deposited by laser ablation form $BaF_2/Y_2O_3/CuO$ targets" Proc. of the Conference on the Science and Technology of Thin Film Superconductros (Colorado Springs, Colorado) Nov. 1988 pp. 61-70.
Witanhachchi et al, "Effect of buffer layers on low-temperature growth of mirror-like superconducting thin films on sapphire", Appl. Phys. lett.55(3) Jul. 1989 pp. 295-297.
CA 110 (2):16990 u SC Thick Films Rautioaho et al. 1988.
Matls Science Letts 7(10) (p. 1133-5) "Prep. of c-axis orented SC Films", Kurosawa et al. 1988.
Applied Phys. Letts 54(14) Apr. 3, 1989, Garzon et al., "Charaterization of SC Thin-Film microbridges to microwave irradiation", pp. 1365-1367.

Primary Examiner—Michael Lusignan
Assistant Examiner—Roy V. King
Attorney, Agent, or Firm—Marvin S. Siskind

[57] ABSTRACT

A laser ablation method for forming a fluorinated superconducting Y-Ba-Cu-O thin film on a sapphire substrate is disclosed, which comprises the steps of: (1) depositing a barrier layer of $BaAl_2O_4$ on the sapphire substrate; (2) placing the coated substrate and a tagret in a deposition chamber, said target including fluorine, barium, yttrium, copper and oxygen; (3) providing a background atmosphere including at least partial pressure of $O_2$ within the chamber; (4) heating the coated substrate to a temperature above ambient; (5) laser-ablating the target material onto the heated substrate while controlling the partial pressure of $O_2$ in said background atmosphere and the temperature of said heated substrate so that the as-deposited thin film on said substrate is superconductive.

8 Claims, 5 Drawing Sheets

IN-SITU GROWTH OF FLOUROUNATED SUPERCONDUCTING, Y-BA-CU-O THIN FILMS ON SAPPHIRE SUBSTRATES WITH A BUFFER LAYER BY LASER ABLATION

This application is a continuation of application Ser. No. 07/569,502 filed on Aug. 20, 1990, now abandoned, which is a continuation application of application Ser. No. 402,313 filed on Sep. 5, 1989, now abandoned.

FIELD OF THE INVENTION

The instant invention relates generally to the new class of high temperature superconducting structures and more particularly to laser ablated, ceramic oxide type high temperature superconducting compositions formed on low loss dielectric substrates. In a first embodiment of the invention, the superconducting composition is laser ablated from a fluorinated multi-phased target. In a second embodiment of the invention, the superconducting structure includes a barium aluminum oxide interfacial layer disposed between and chemically separating a barium-containing superconducting composition and a sapphire substrate.

BACKGROUND OF THE INVENTION

One of the many as yet unresolved problems which remain with the newly developed high $T_c$ superconducting compositions, for example of the 1-2-3-$O_7$ and 2-2-2-3-$O_{10}$ types, is the extremely anisotropic nature of electrical current flow therethrough. While these superconducting compositions have been said to be revolutionary because of the high currents densities which they can carry at above liquid nitrogen temperatures, it has now been proven that the current preferentially flows along the Cu-O plane. This anisotropic current flow has been one of the major impediments to the development of practical electrical devices employing those superconducting compositions. It is currently foreseen that the first applications of the new high $T_c$ superconductors will not be for power storage, but rather to form very sensitive, low loss, low impedance waveguides for transmitting and receiving microwave signals for outer space applications where weight reduction vis-a-vis, copper waveguides is significant. See an article in *Supercurrents*, July, 1989, pp. 66–71 by Bob Hammond entitled "Passive Microwave Devices and High-$T_c$ Superconductors." In this application, the interior walls of the waveguide will be formed of superconducting compositions deposited upon low loss dielectric substrates. The low loss nature of the substrate is essential. This is because the electric field generated by the microwaves penetrates some finite distance into the substrate. Therefore, even if the superconducting composition is anisotropic and can therefore carry current with minimal complex impedance loss, the lossy substrate, itself, attenuates the microwave energy and represents a source of loss if it is not transparent to those microwaves. Accordingly, one should appreciate that in order to develop low loss superconducting structures, two features are required: (1) a high current-carrying capacity superconducting composition which is aligned in at least the current carrying direction, and (2) a substrate fabricated from a low loss dielectric material upon which the superconducting composition can be deposited. The superconducting structures of the instant invention fulfill both of these requirements.

Until the instant invention, the high current carrying capability of the high $T_c$, 1-2-3-$O_7$ type of superconducting composition has only been demonstrated either in (1) relatively small single crystals; or (2) with thin films epitaxially grown on relatively high dielectric loss substrates, such as $SrTiO_3$, $KTaO_3$, etc. The methods and superconducting structures of the instant invention overcome these problems, allowing for the deposition of a high quality, C-axis oriented, preferably polycrystalline, $Y_1Ba_2Cu_3O_7(F)$-type superconducting composition on low loss dielectric sapphire substrates. In this regard, it is noted that in commonly assigned U.S. patent application Ser. No. 043,279, filed Apr. 27, 1987 of Ovshinsky, et al now abandoned, the assignee of the instant invention first disclosed the use of a fluorinated precursor powder (such as $BaF_2$) to both stabilize and orient the grains of 1-2-3-$O_7$ perovskite ceramic oxide type superconducting compositions for improving the current carrying capacity thereof along a preferred direction. However, those powder metallurgically prepared thick films and pellets were multi-phased. It was not until the use of fluorine in the target employed in the laser ablative technique of the instant invention, detailed hereinafter, that there was disclosed the growth of single phase, oriented superconducting films on low loss dielectric substrates.

In this regard, it is important to note the instant inventors do not claim to have discovered the deposition of 1-2-3-$O_7$ type of superconducting compositions on a $Al_2O_3$ substrate. While other researchers have deposited 1-2-3-$O_7$ compositions on a sapphire substrate, those other researchers have been unable to grow large grains by any process other than an epitaxial one. However, in order to grow large oriented grains in an inexpensive manner, it is essential to separate the 1-2-3-$O_7$ composition from the aluminum and oxygen elemental components of the sapphire substrate. If these components are not separated, the barium from the unit cells of the superconducting composition chemically reacts with the substrate, thereby (1) destroying the unit cells for a large thickness of superconducting composition growth and (2) creating a plurality of non-superconducting phase compositions which interferes with the growth of the superconducting phase composition. When other researchers have attempted to interpose a barrier layer between the superconducting composition and the substrate to prevent the interdiffusion of elements, the structure of the barrier layer did not readily lend itself to the growth of the superconducting 1-2-3-$O_7$ phase thereupon.

These and other improvements and advantages of the instant invention will be more fully understood after carefully perusing the detailed description which follows.

SUMMARY OF THE INVENTION

Disclosed herein is a superconducting structure comprising a sapphire substrate upon which a barium containing superconducting ceramic oxide composition is deposited. The improvement comprises an interfacial layer in direct contact with and separating the substrate and the superconducting composition. The layer includes a substantially atomically smooth surface interfacing with the superconducting composition. The layer is substantially non-reactive with the superconducting composition so as to form a barrier layer between the elements of the superconducting composition and the sapphire substrate. The barrier interfacial layer preferably comprises barium, aluminum and oxygen having the nominal composition $BaAl_2O_4$. The interfacial layer is preferably deposited to a thickness of about 50 to about 500 Angstroms and most preferably from about 70 to about 150 Angstroms.

The superconducting composition is preferably a high $T_c$ 1-2-3-$O_7$ type ceramic oxide perovskite material. The preferred stoichiometry of the superconducting composition is $Y_1Ba_2Cu_3O_7$, which composition may further include fluorine. Where the superconducting composition includes fluorine, the nominal composition thereof is $Y_1Ba_2Cu_3O_{7-Delta}F_{Epsilon}$. The values of Delta and Epsilon are interrelated, and are determined by the concentration of fluorine, which is in the range of about 0.05 to about 0.5 atomic percent and preferably about 0.1 atomic percent. In an alternate embodiment, the superconducting composition can be a high $T_c$ 2-2-2-3-$O_{10}$ copper oxide perovskite material. The superconducting composition is preferably $Tl_2Ba_2Ca_2Cu_3O_{10}$ and if that composition further includes fluorine, the nominal composition thereof shall change to $Tl_2Ba_2Ca_2Cu_3O_{10}F_{Epsilon}$.

There is further disclosed herein a method of forming a superconducting structure which comprises a barium containing superconducting composition deposited on a sapphire substrate. The improved steps comprise laser ablating a multi-phased target formed of a precursor of a superconducting composition onto the sapphire substrate and including fluorine in the elements from which the target is fabricated. The method further includes the step of depositing an interfacial layer in contact with and separating the elements of the sapphire substrate from the elements of the superconducting composition. The interfacial layer preferably comprises barium, aluminum and oxygen having the nominal stoichiometry of $BaAl_2O_4$. The interfacial layer is preferably deposited to a thickness of about 50 Angstroms to about 500 Angstroms and most preferably to a thickness of about 70 Angstroms to about 150 Angstroms. The interfacial layer preferably forms a substantially atomically smooth surface upon which the superconducting composition is deposited.

The laser ablative target preferably comprises barium, yttrium, copper and oxygen and may further include fluorine in a multi-phased material. The target has a nominal composition of $Y_1Ba_2Cu_3O_6F_1$ and when it contains fluorine, is preferably fabricated from $Y_2O_3$, $BaCO_3$, CuO, and $BaF_2$ powders.

By applying the principles of the invention disclosed herein, the electrical transport properties (current carrying capabilities) of the 1-2-3-$O_7$ type high critical temperature superconducting compositions have been enhanced. Specifically, in the case of non-epitaxially grown $Y_1Ba_2Cu_3O_7$ type superconducting films deposited onto sapphire substrates, the electrical transport properties have been improved by providing a substantially atomically smooth interfacial layer between that sapphire substrate and the thin film of superconducting composition. As used herein, the term "atomically smooth" will refer to the surface of the interfacial layer being formed of grains of about 50-500 Angstrom size. Moreover, the properties of the superconducting composition have been improved by depositing the superconducting composition utilizing a laser ablation process which includes a fluorine containing multi-phased target.

It should therefore be appreciated that the high quality superconducting structures of the instant invention, particularly including a thin films of 1-2-3-$O_7$ or 2-2-2-3-$O_{10}$ type, high $T_c$ ceramic oxide superconducting composition on a sapphire ($Al_2O_3$) substrate are useful in many high frequency applications, especially in gigahertz frequency (microwave receiving and transmitting) devices. However, in the past, the fabrication of single phase 1-2-3-$O_7$ type superconductor films on sapphire substrates has resulted in detrimental interactions between the barium from the 1-2-3-$O_7$ ceramic oxide type superconducting composition and the aluminum and oxygen from the sapphire substrate. This interdiffusion of elements resulted in the destruction of the unit cell of the 1-2-3-$O_7$ type composition for a given distance into the thickness of thereof, i.e., until saturation occurred. This interdiffusion of elements also resulted in the growth of regions of non-superconducting material between regions of large grain superconducting material.

According to the method and structure of the instant invention, it is now possible to fabricate high quality superconducting structures, characterized by good electrical transport properties (due to the elimination of the interdiffusion of elements between the superconducting composition and the sapphire substrate), by the expedient of first forming a barium-aluminum-oxygen film between the superconducting composition and the sapphire substrate, and thereafter depositing by laser ablation the superconducting composition atop the barium-aluminum-oxygen film. The barium-aluminum-oxygen film forms an excellent template from the growth of large grain superconducting material upon the atomically smooth surface thereof. It is particularly preferred that the target used for laser beam ablation be fluorine containing.

According to the instant invention, the presence of fluorine during the laser ablation process, possibly, but not necessarily results in the incorporation of a small amount of fluorine into the superconducting composition during the growth thereof. Whether the fluorine is incorporated into the composition, or whether it aids in the formation of the grains (promotes grain growth), experimental results have proven that it markedly enhances $T_c(R=0)$. For example, a 0.5 mm thick YBaCuO(F) film deposited directly on a sapphire substrate by laser ablation exhibits a $T_c$ (R=0) of 84–86K, while a similarly deposited film without fluorine, exhibits a $T_c(R=0)$ of 75–79K. Microphotographs taken of the superconducting fluorinated composition clearly reveals that the film deposited from a fluorine containing target is completely oriented with the C-axis perpendicular to the sapphire substrate. This film exhibits a critical current density (Jc) of $5.2 \times 10^3$ $A/cm^2$ measured at 77K.

THE FIGURES

The invention may be understood by reference to the figures.

FIG. 1 illustrates an X-ray diffraction pattern of an multi-phase fluorinated target with a nominal composition of $Y_1Ba_2Cu_3O_6F_1$; and of a "single phase" oriented YBaCuO(F) superconducting film deposited therefrom onto a sapphire substrate deposited by laser ablation from the multi-phase fluorinated target., FIG. 2 illustrates the Resistivity vs. Temperature plots for in-situ laser ablated films on sapphire substrates of (1) the Y-Ba-Cu-O-F superconducting film of the instant invention from a multi-phase fluorinated target, and (2) the Y-Ba-Cu-O superconducting film from a single phase 1-2-3-$O_7$ target;

FIG. 3 illustrates the bright field TEM micrograph of an as-deposited YBaCuOF film on a sapphire substrate having the top surface thereof thinned by an ion milling process;

FIG. 4 illustrates a high resolution lattice image taken from a JEOL 4000 EX microscope at 400 KV for the superconducting structure of the instant invention; this lattice image shows the superconducting composition, the interface and the sapphire substrate, including the detail of the 11.7 mm lattice spacing of the superconducting composition; and FIG. 5 illustrates a transmission electron micrograph showing the columnar grains of 1-2-3-$O_7$ type superconducting material, with the impurity phases of yttrium copper oxide disposed between the columnar 1-2-3-$O_7$ grains.

DETAILED DESCRIPTION OF THE INVENTION

Figure 1:
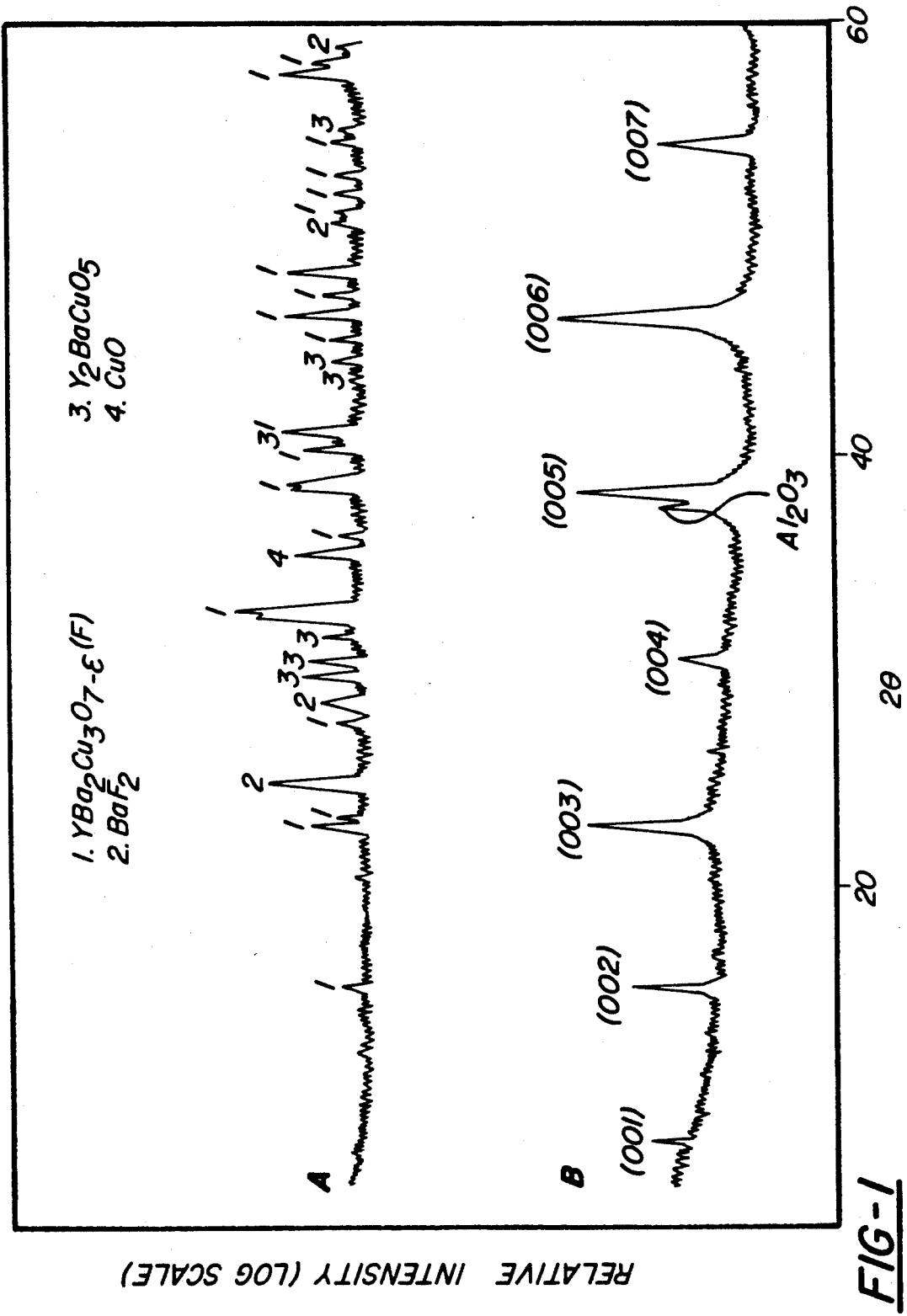

The superconducting structure of the invention is made up of a thin film, layer, coating, or surface of a high $T_c$ barium containing superconducting ceramic oxide type composition deposited on a sapphire substrate. According to a preferred exemplification of our invention there is an interfacial layer disposed between and in contact with the sapphire substrate and the superconducting composition. This interfacial layer chemically separates the elements of the substrate from the elements of the superconducting composition. The interfacial layer preferably includes a substantially atomically smooth surface which interfaces with the layer of the superconducting composition. The chemical composition of the interfacial layer is selected so as to be substantially non-reactive with the superconducting composition.

The interfacial layer preferably comprises barium, aluminum, and oxygen. Most commonly, the interfacial layer consists essentially of $BaAl_2O_4$. The interfacial layer has a thickness of from about 50 Angstroms to about 500 Angstroms, and preferably from about 70 Angstroms to about 150 Angstroms; and is characterized by an atomically smooth upper surface of about 50 to 150 Angstrom grain sizes.

The superconducting composition may preferably be either a 1-2-3-$O_7$ type perovskite oxide or a 2-2-2-3-$O_{10}$ type copper oxide. The 1-2-3-$O_7$ type perovskite oxides are exemplified by $Y_1Ba_2Cu_3O_7$. In a preferred embodiment, the 1-2-3-$O_7$ composition contains fluorine, and the composition is described by the formula $Y_1Ba_2Cu_3O_{7-Delta}F_{Epsilon}$. Delta and Epsilon which are interrelated and are determined by the fluorine concentration. The fluorine concentration sufficient to obtain this condition is on the order of about 0.05 to about 0.5 atomic percent and preferably about 0.1 atomic percent.

Exemplary 2-2-2-3-$O_{10}$ type copper oxide superconductors have the nominal composition of $Tl_2Ba_2Ca_2Cu_3O_{10}$, and may optionally include fluorine. The fluorine containing copper oxide type superconducting compositions have the nominal composition $Tl_2Ba_2Ca_2Cu_3O_{10-Epsilon}F_{Epsilon}$, where Epsilon is as defined above.

According to a preferred embodiment of the instant invention, the thin film of superconducting composition is prepared by laser ablation of a precursor target containing fluorine. Preferably the target is multi-phased; for example, a target containing a $BaF_2$ phase and an yttrium-barium-copper-oxygen phase.

According to the preferred exemplification of the instant invention, the superconducting film may be formed by the laser ablation of a multi-phased, $Y_1BaCu_3O_7 \cdot BaF_2$ — $Y_2BaCuO_5$ — CuO target having a nominal composition of $Y_1Ba_2Cu_3O_6F_1$. One thin film formed from this target was a 0.5 mm thick film, having an as-deposited zero resistance temperature of 86 K. and a critical current density at 77 K. of $5.2 \times 10^3$ A/cm$^2$. When this thin film structure was analyzed, cross-sectional transmission electron microscopy which showed that the film had a columnar, aligned grain structure with the C-axis of the grain disposed normal to the plane of the substrate. A high resolution lattice image showed that this film had a high degree of crystalline order.

Particularly noteworthy in this superconducting structure was the presence of a thin layer of chemically reacted barium aluminum oxide (7-15 nm thick) disposed between the superconducting composition and the sapphire substrate. Additionally, small amounts of impurity phases such as yttrium copper oxide and copper oxide were also present in the film. These inclusions were primarily located between the columnar grains of the superconducting composition. The instant inventors hypothesize that barium from the composition chemically reacted with aluminum and oxygen from the sapphire substrate to form said barium aluminum oxide layer. It must be noted that the chemical reaction saturated and the growth of large grain 1-2-3-$O_7$F material began; however, the presence of the impurity phases prevented the growth of even larger grains of the superconducting composition. It was based upon this finding that the instant inventors determined it to be necessary to form a non-reactive barrier layer between the substrate and the superconducting composition.

EXAMPLES

The experimental results will first be described generally, and then in detail. According to the method of the invention, superconducting YBaCuO(F) films were prepared a laser ablasion technique with a 308 nm XeCl excimer laser fired at 0.4 Hz onto a rotating 1 inch diameter and one-quarter inch thick multi-phase sintered target with a nominal composition of $Y_1Ba_2Cu_3O_6F_1$. During the laser deposition, the chamber was maintained at an oxygen partial pressure of about 200 millitorrs and the substrate holder for the sapphire substrate was maintained at a temperature of about 720° C. The substrate was mechanically clamped to the holder and rotated. The surface temperature was measured to be about 100° C. lower than the temperature of the substrate holder. After the deposition process was completed, the samples were slowly cooled down to room temperature in approximately 40 minutes.

The electrical transport properties of the superconducting films were measured by a standard four-probe dc measurement. The critical current density was measured on a 0.5 × 3.0 mm line defined by a laser scribing technique.

The quality of the superconducting film as well as the interface reactions thereof with the substrate were studied by using a JEOL 2000FX analytical electron microscope and a 400 KV JEOL 4000EX ultra-high resolution transmission electron microscope. For these tests, cross-sectional specimens were prepared by bonding two slices of the substrate together with the film side face to face using epoxy. This was followed by mechanical polishing, dimpling and argon ion milling with liquid nitrogen cooling.

FIG. 1 shows the X-ray diffraction pattern of a fluorinated target with the nominal composition of $Y_1Ba_2Cu_3O_6F_1$. The multi-phase nature of the target material which consists of $BaF_2$, $CuO$, $Y_2Ba_1Cu_1O_{5-x}$ and $Y_1Ba_2Cu_3O_{7-y}$ phases is clearly seen from the characteristic peaks in the diffraction data.

The X-ray diffraction pattern of a film deposited by the laser ablation of the fluorinated target is also shown in FIG. 1, said pattern indicating that this film is substantially single phase. Only the (00l) diffraction peaks, with l=1, 2, 3, 4, and 5, along with an $Al_2O_3$ peak from the sapphire substrate are detected. The 100% random diffraction peaks at (110), (013)/(103) are barely resolvable, indicating that the C-axis of the superconducting film is aligned in a direction predominately normal to the substrate. The fluorine content in the film is just beyond the detection limit of the electron microprobe i.e. approximately 0.1 atomic percent. This indicates that most of the fluorine from the target is lost to the chamber during the laser vaporization process. Nevertheless, zero resistivity measurements of superconducting structures where the films were ablated from the fluorinated target consistently show better electrical transport properties than those where the films were ablated from the non-fluorinated single phase $123O_7$ target. The presence of fluorine is clearly shown by Secondary Ion Mass Spectroscopy.

Figure 2:
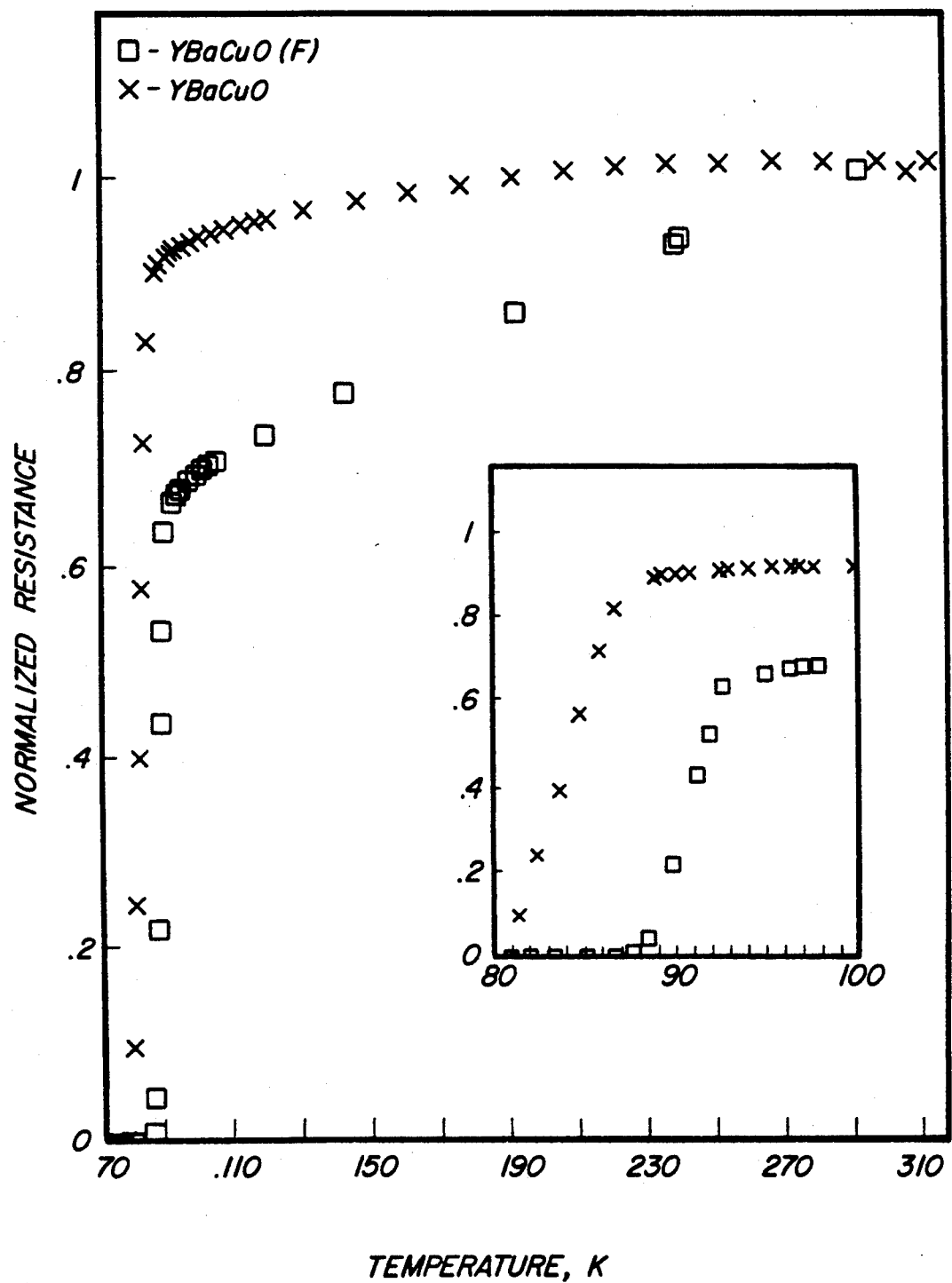

FIG. 2 is a comparison of the superconducting transition characteristics of two laser ablated films. The Y-Ba-Cu-O-F film was deposited from a multi-phase fluorinated target and the Y-Ba-Cu-O film was deposited from a single phase 123 target. The deposition conditions for the laser ablation were kept the same. Both of the films were 0.5 mm thick. The Y-Ba-Cu-O film had an onset temperature of 88 K. and a $T_c(R=0)$ at 78 K.; while the Y-Ba-Cu-O-F film had an onset temperature of 94 K. and a $T_c(R=0)$ at 86 K.

It is important to note that the steeper normal state resistivity-temperature slope of the Y-Ba-Cu-O-F film indicates the better metallic behavior of the fluorinated film. As will be described more fully hereinbelow, these results represent data from a group of films which were deposited over a period of time from several different targets.

In the examples below, the film quality, the growth characteristic and the nature of the interface reaction were studied by cross-sectional transmission electron microscopy. A JEOL 2000FX electron microscope with the X-ray analytical capability was used to determine the various chemically reacted phases. A JEOL 4000 EX microscope was used to study the high resolution lattice image.

Figure 3:

FIG. 3 is a bright field TEM cross-sectional image from JEOL 2000FX of a YBaCuOF film on sapphire. The nature of the columnar grains and the sharp vertical boundaries across the entire film thickness is clearly seen from the micrograph. The top surface of the film was thinned by an ion milling process and does not represent the pristine surface.

FIG. 3 clearly shows an irregular interface of barium aluminum oxide from 7-15 nm between the superconducting film and the sapphire substrate. The micrograph shows that within the columnar grains, the chemical composition is very homogeneous $Y_1Ba_2Cu_3O_x(F)$. No second phase was detected.

Figure 4:
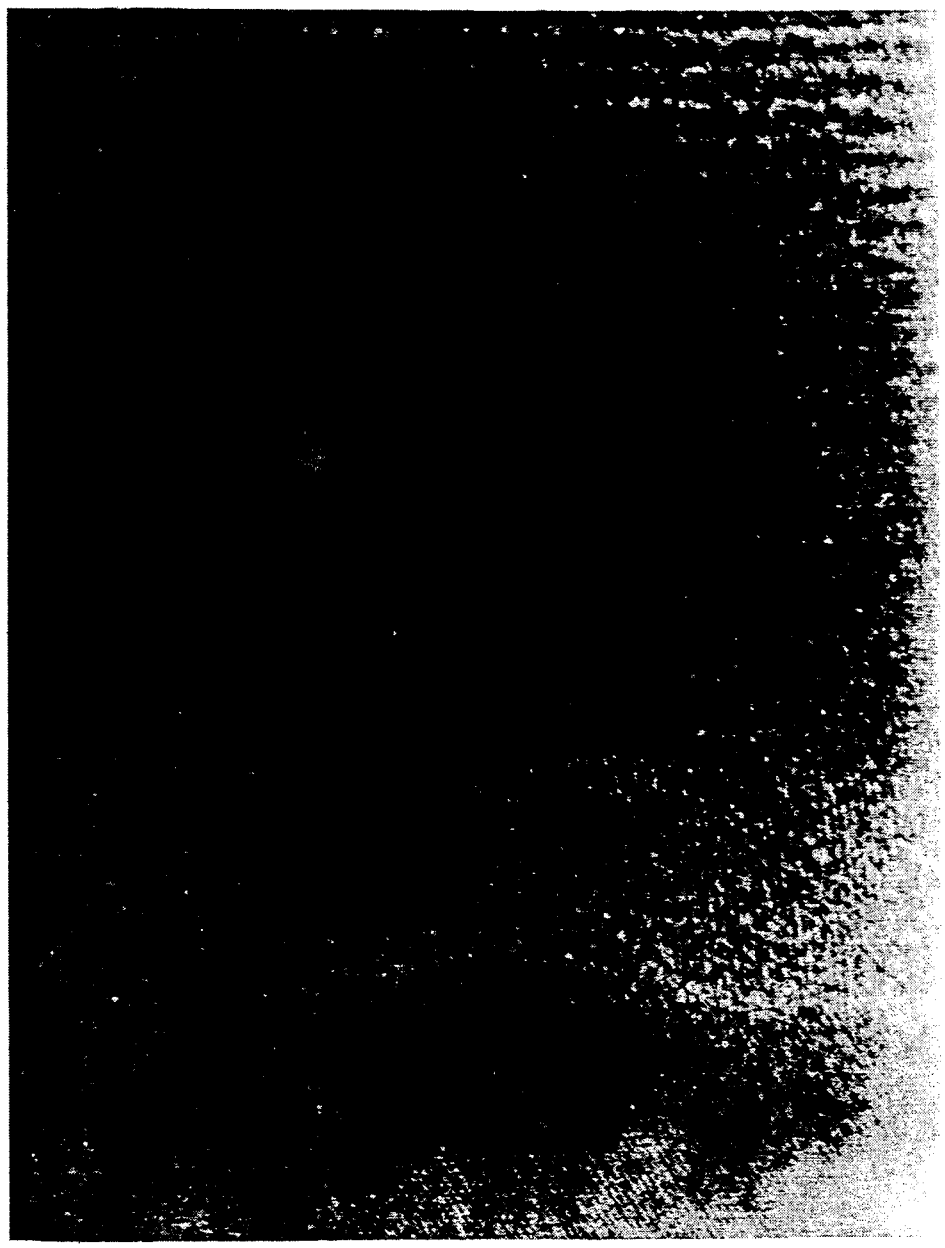

FIG. 4 is a high resolution lattice image taken a JEOL 4000 EX microscope at 400 KV. This Figure shows details of the superconducting film, the interface region and the sapphire substrate. As can be seen from the photomicrograph, the barium aluminum oxide interface is not sharply defined. The 3.1 nm spacing of the interface layer runs nearly vertical to the substrate, and extends to a thickness of approximately 70-100 nm. There are small regions where a 3.1 nm fringe runs a few hundred nm deep down to the superconducting film. The superconducting layer exhibits a darker fringe of 11.7 nm spacing, horizontal to the substrate. This confirms that the C-axis of the film is perpendicular to the substrate. Adjacent to the interface, the 11.7 nm thick superconducting layers are frequently discontinuous and staggered by the 3.1 nm fringes.

Figure 5:
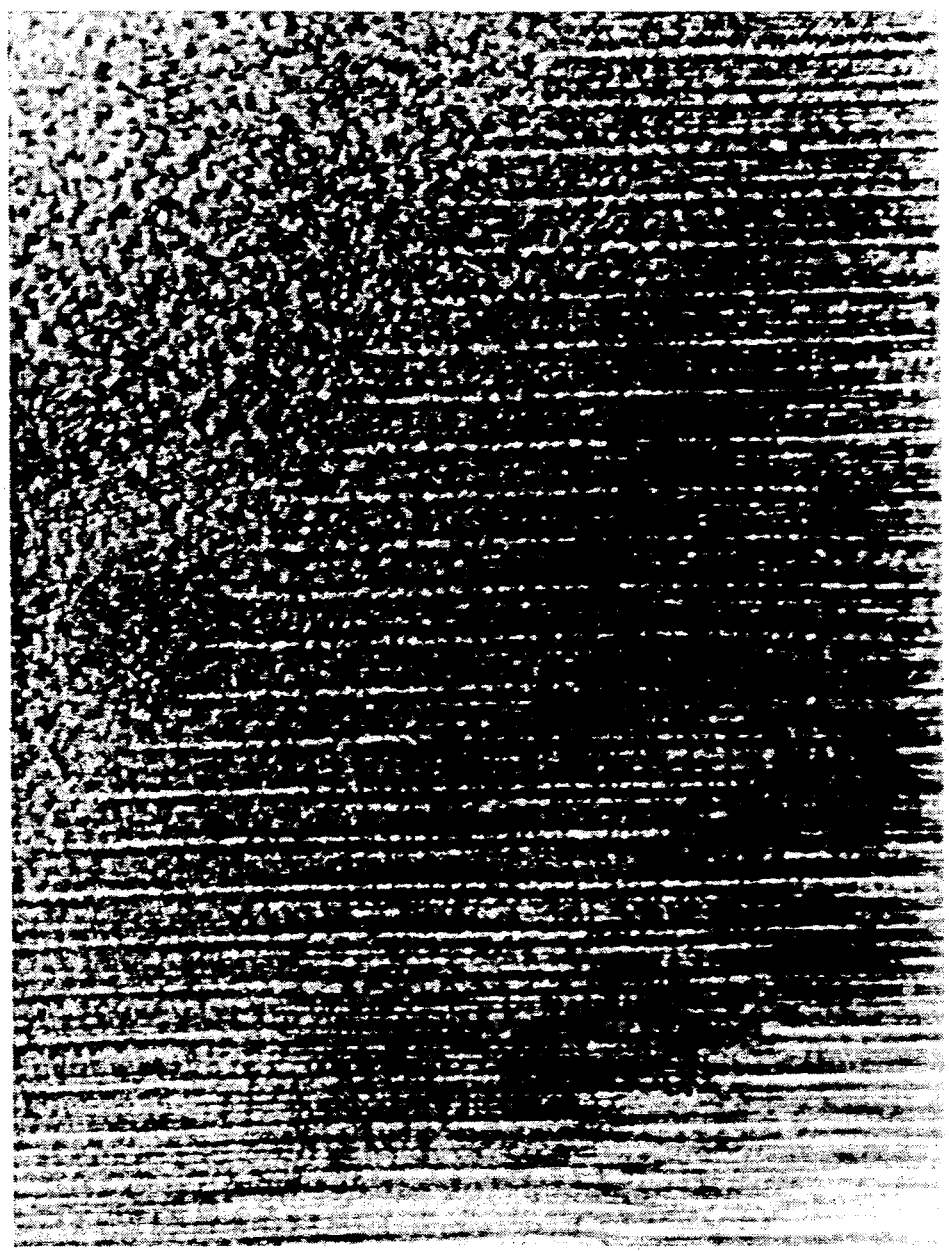

FIG. 5 is a high resolution lattice image of the superconducting film, taken at a region away from the interface. In this Figure the 11.7 nm lattice spacing is clearly seen. This shows the high quality crystalline order of the film.

Since barium from a $Y_1Ba_2Cu_3O_7$ type film deposited directly onto a sapphire substrate chemically reacts with the $Al_2O_3$ of the sapphire substrate to form a thin barium aluminum oxide layer, various other impurity phases, such as $YCu_2O_x$ and $CuO$, are also observed from cross-sectional TEM when the separately deposited $BaAl_2O_4$ film of the instant invention is omitted. This is clearly shown in FIG. 5, where the $Y_1Ba_2Cu_3O_7$ type film is deposited directly atop the sapphire substrate, and barium copper oxide and copper oxide impurity phases are clearly evident. However, they are at the detectable limits of X-ray diffraction as seen in FIG. 1. The estimated amount of impurity phases is less then 1 at. %. These impurity phases are located predominantly between the columnar grains. These impurity phases, as well as Al, preferentially diffuse at grain boundaries. It is these intergranular materials that degrade the electrical transport properties of the film.

EXAMPLE

Thin film devices were proposed by laser ablation of a multi-phase $BaF_{2-y}$, $Ba_2Cu_3O_7$, $Y_2BaCuO_5$, $CuO$ target onto a sapphire substrates.

Sapphire substrates, approximately 4 millimeters by 12 millimeters, were coated with $BaAl_2O_4$ films by electron beam evaporation of a $BaF_2$ source in a vacuum chamber. To commence the process, the vacuum chamber was taken to a vacuum of $10^{-5}$ to $10^{-6}$ torr. The $BaF_2$ source was then evaporated with an electron beam gun. The electron beam gun was a Sloan 270° single hearth electron beam gun, spaced approximately 40 centimeters from the heated sapphire substrate. The electron beam power was 100 milliamperes at 6 kilovolts. Electron beam evaporation was continued until an as-deposited thickness of approximately 500 to 2000 Angstroms was obtained. When the desired thickness was attained, evaporation was discontinued, and the $BaF_2$ coated sapphire substrate was annealed at 720° C. to 850° C. for periods from approximately five minutes to approximately five hours in wet oxygen to form a fine grained $BaAl_2O_4$ film on the sapphire substrate.

The superconducting material was laser ablated from a target onto the $BaAl_2O_4$ coated sapphire substrates. The laser ablation targets were prepared by blending fluorine containing precursors as $BaF_2$ with non-fluorinated precursors as $Y_2O_3$, $BaCO_3$, and $CuO$. Specifically, the precursors were prepared by thoroughly mixing the following powders:

| Powder | Mass |
|---|---|
| $Y_2O_3$ | 3.07 gms |
| $BaCO_3$ | 8.05 gms |
| CuO | 6.49 gms |
| $BaF_2$ | 2.38 gms. |
| Total | 20.00 grams. |

The precursor materials were then heated in air, at standard pressure, in a platinum crucible according to the following time-temperature program:

| Time | Temperature |
|---|---|
| 26.5 hours | 920 degrees Centigrade (Required) |
| 16.25 hours | 920 degrees Centigrade (Required) |
| 16 hours | 920 degrees Centigrade |

After the heating and cool-down process, the precursor material was then pressed at approximately 18 tons per square inch into a cylindrical configuration measuring approximately 1 inch in diameter by approximately 0.25 inch in thickness and fired under flowing oxygen according to the following time-temperature program:

| Time | Temperature |
|---|---|
| 12 hours | Ramped from 200 degrees up to 950 degrees Centigrade |
| 16 hours | 950 degrees Centigrade |
| 8 hours | Ramped from 950 degrees Centigrade down to 200 degrees Centigrade |

The cylindrical target was then removed from the alumina crucible and utilized as a multi-phase target.

The target was then place in a vacuum chamber. The chamber was pumped down to a pressure of approximately $10^{-5}$ to $10^{-6}$ torr. Oxygen was then introduced into the chamber at a pressure of 200 millitorr. The $BaAl_2O_4$ coated sapphire substrate was then heated to a temperature of approximately 720° C. while being rotated. The multi-phase target was then bombarded with incident radiation from a XeCl laser. The laser power was approximately 2 to 5 joules/centimeter$^2$, and the laser frequency was approximately 0.2 to 5 hertz. The 1-2-3-$O_7$ coating was built up to a thickness of approximately 5000 Angstroms. At that time the laser ablation was halted, and the sapphire substrate was cooled to room temperature (approximately 27° C.) over 40 minutes.

The method of the instant invention, as described hereinabove, has been shown to provide a substantially completely C-axis oriented superconducting composition with a high degree of crystalline order, on a sapphire substrate. The presence of a relatively small, but effective, amount of fluorine during the growth process is believed to provide increased alignment and hence a marked improvement of the electrical transport properties thereof.

While the invention has been described with respect to certain preferred exemplifications and embodiments thereof, it is not intended to limit the scope of the invention thereby, but rather, the scope of the invention is to limited solely by the claims appended hereto.

We claim:

1. A method of depositing a fluorinated Y-Ba-Cu-O thin film superconductor onto a sapphire substrate, said method including the steps of:

providing said sapphire substrate;

depositing a barrier layer of $BaAl_2O_4$ onto at least one surface of said sapphire substrate;

providing a target, said target including at least the elements fluorine, barium, yttrium, copper and oxygen;

providing a chamber defining a deposition region therewithin;

placing said target into said chamber;

evacuating said chamber to sub-atmospheric pressure;

providing a background atmosphere including at least a partial pressure of $O_2$ within said deposition region;

heating the sapphire substrate, including the barrier layer, to a temperature above ambient;

providing a laser;

laser ablation depositing the target material, in said background atmosphere, onto the barrier layer of the heated substrate; and controlling the partial pressure of $O_2$ in said background atmosphere within said deposition region and the temperature of said coated sapphire substrate, during laser ablation, such that the as deposited thin film superconductor material is superconductive.

2. The method of claim 1 comprising depositing the barrier layer to a thickness of from about 50 Angstroms to about 500 Angstroms.

3. The method of claim 2 comprising depositing the barrier layer to a thickness of from about 70 Angstroms to about 150 Angstroms.

4. The method of claim 1 comprising depositing the barrier layer to form a substantially atomically smooth surface on the barrier layer, and thereafter depositing the superconducting composition atop the barrier layer.

5. The method of claim 1 wherein the target comprises barium, yttrium, copper, oxygen and fluorine.

6. The method of claim 5 wherein the target is formed as a multi-phase material.

7. The method of claim 6 wherein the target has the nominal composition $Y_1Ba_2Cu_3O_6F_1$.

8. The method of claim 7 comprising fabricating the target from $Y_2O_3$, $BaCO_3$, CuO, and $BaF_2$ powders.

* * * * *